(12) United States Patent
Muramatsu

(10) Patent No.: US 6,387,756 B1
(45) Date of Patent: May 14, 2002

(54) MANUFACTURING METHOD OF NON-VOLATILE SEMICONDUCTOR DEVICE

(75) Inventor: Satoru Muramatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/698,245

(22) Filed: Oct. 30, 2000

(30) Foreign Application Priority Data

Oct. 29, 1999 (JP) ............................................. 11-309065

(51) Int. Cl.[7] ............................................. H01L 21/336
(52) U.S. Cl. ....................... 438/266; 438/257; 438/261; 438/593
(58) Field of Search ................................. 438/257, 263, 438/264, 266, 267, 258, 259, 260, 262, 593

(56) References Cited

U.S. PATENT DOCUMENTS 6,187,632 B1 * 2/2001 Shuto et al. ................. 438/257

FOREIGN PATENT DOCUMENTS

JP 08-330198 A 12/1996
JP 10-284588 A 10/1998

* cited by examiner

*Primary Examiner*—Charles Bowers
*Assistant Examiner*—Jack Chen
(74) *Attorney, Agent, or Firm*—McGinn & Gibb, PLLC

(57) ABSTRACT

The present invention relates to a method of manufacturing a non-volatile semiconductor device having a structure in which layers of a first insulating film, a first polysilicon layer, a second insulating film and a second polysilicon layer are formed, in this order, on a semiconductor substrate; which comprises the steps of forming the first insulating film on the semiconductor substrate and thereafter forming the first polysilicon layer; patterning the first polysilicon layer; performing a heat treatment in hydrogen atmosphere; forming the second insulating film; forming the second polysilicon layer; and patterning the second polysilicon layer. In accordance with the present invention, a non-volatile semiconductor device having excellent hold characteristics and only a small dispersion of element characteristics can be manufactured.

13 Claims, 4 Drawing Sheets

MANUFACTURING METHOD OF NON-VOLATILE SEMICONDUCTOR DEVICE

BACKGROUND OF THE INVENTION

1. Field of the Invention

The present invention relates to a manufacturing method of a non-volatile semiconductor device.

2. Description of the Related Art

Taking the case of a flash memory as an example, a conventional manufacturing method of a non-volatile semiconductor device is described below.

First, as shown in FIG. 4(a), element isolation regions 2 are formed on a silicon substrate 1 by an ordinary method, and a silicon oxide film is formed on the surface of the silicon substrate. Through this silicon oxide film, ion implantation of dopants such as boron is, then, applied over the surface of the silicon substrate so as to set a prescribed threshold value. Next, after this silicon oxide film is removed, a tunnel oxide film 3 made of a silicon oxide film is formed by the thermal oxidation method.

Next, as shown in FIG. 4(b), a polysilicon layer 4 which is to serve later as a floating gate is grown over the entire surface. The dopants to provide the conductivity can be introduced thereinto, together with forming the polysilicon layer or afterwards through ion implantation. In this instance, concurrently with formation of the polysilicon layer, N-type dopants such as P are introduced thereinto.

Next, as shown in FIG. 4(c), the polysilicon layer 4 is patterned by means of lithography and dry etching to form a floating gate 5.

After that, as shown in FIG. 4(d), an inter-gate insulating film 6 of an ONO film (a silicon oxide film/a silicon nitride film/a silicon oxide film) or the like is formed.

Next, after a polysilicon layer is formed over the entire surface, ion implantation of N-type dopants such as P and, then, patterning by means of lithography and dry etching are applied thereto, which forms a control gate 7, as shown in FIG. 4(e).

Subsequently, for source-drain formation, ion implantation of dopants is carried out by an ordinary method.

The manufacturing method of a non-volatile semiconductor device as described above has, however, the following problem.

That is, as shown in afore-mentioned FIG. 4(c), a floating gate formed by a conventional method has, at each end, a ridge section rising steeply to form an acute vertical angle, and besides the gate surface thereof is uneven due to the presence of polysilicon grains. Consequently, in the structure (FIG. 4(e)) wherein an inter-gate insulating film 6 and a control gate 7 are formed over a floating gate of this sort, electric field centralization may occur locally in the ridge sections at both ends of the floating gate and in uneven places on the surface of the floating gate and give rise to the leakage current. This causes dispersion and deterioration of element characteristics of semiconductor device such as dispersion of the erasure and deterioration of hold characteristics. The generation of such leakage current is considerable, especially in the ridge sections at both ends of the floating gates in the semiconductor device.

SUMMARY OF THE INVENTION

An object of the present invention is to provide a manufacturing method of a non-volatile semiconductor device that can overcome the above problem and produce a non-volatile semiconductor device having excellent hold characteristics and only a small dispersion of element characteristics.

The present invention relates to a method of manufacturing a non-volatile semiconductor device having a structure in which layers of a first insulating film, a first polysilicon layer, a second insulating film and a second polysilicon layer are formed, in this order, on a semiconductor substrate; which comprises the steps of:

forming the first insulating film on the semiconductor substrate and thereafter forming the first polysilicon layer;

patterning the first polysilicon layer;

performing a heat treatment in hydrogen atmosphere;

forming the second insulating film;

forming the second polysilicon layer; and patterning the second polysilicon layer.

The present invention can suppress the dispersion and the deterioration of element characteristics that is the very problem of the conventional manufacturing methods. Furthermore, because the inter-gate insulating film can be made considerably thin, the erasing voltage can be reduced, allowing the semiconductor device to operate at lower voltages.

DETAILED DESCRIPTION OF THE PREFERRED EMBODIMENTS

The preferred embodiment of the present invention is described in detail below.

A manufacturing method of the present invention is particularly suited for a non-volatile semiconductor device having a structure in which layers of a first insulating film, a first polysilicon layer, a second insulating film and a second polysilicon layer are formed, in this order, on a semiconductor substrate, wherein the second insulating film and the second polysilicon layer are formed in such a way differences in level of the first polysilicon layer is completely covered therewith. For example, the present invention can be well applied to a flash memory, an EPROM (Erasable Programmable Read-Only Memory) and the like.

Now, taking the case of a flash memory as an example, the present invention is described below.

Figure 1:
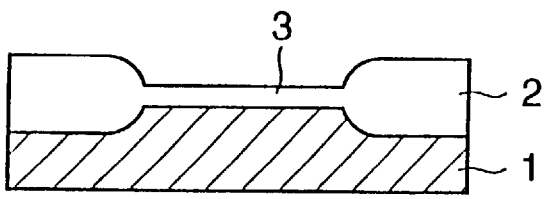
FIGS. 1(a)–1(e) are a series of cross-sectional views illustrating the steps of a manufacturing method in accordance with the present invention.
Figure 1:
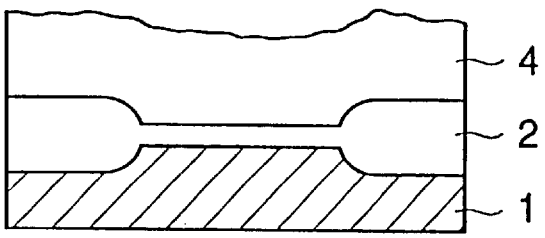
Figure 1:
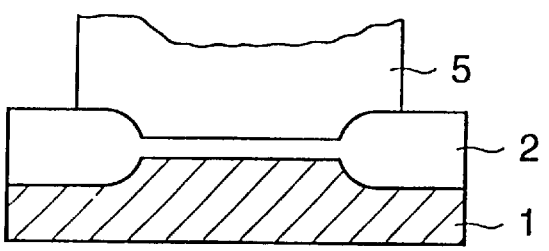
Figure 1:
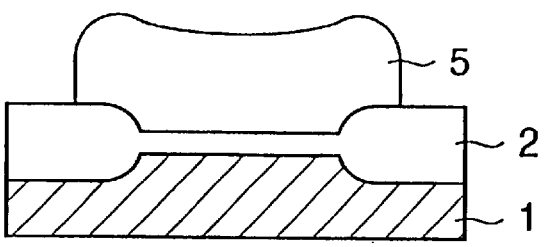
Figure 1:
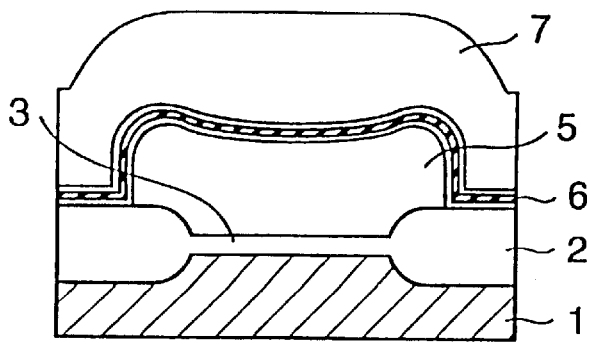

First, as shown in FIG. 1(a), element isolation regions 2 are formed on a silicon substrate 1 by an ordinary method, and a silicon oxide film is formed on the surface of the silicon substrate. Through this silicon oxide film, ion implantation of dopants such as boron is, then, applied over the surface of the silicon substrate so as to set a prescribed threshold value. Next, after this silicon oxide film is removed, a tunnel oxide film 3 made of a silicon oxide film is formed by the thermal oxidation method. To obtain a still more reliable tunnel oxide film, oxidation by ramp anneal may be carried out in the atmosphere that includes, in addition to oxygen, a nitrogen-containing compound such as $N_2O$, NO, $NO_2$, $NH_3$ or the like, and a silicon nitride oxide film may be formed, instead of a silicon oxide film.

Next, as shown in FIG. 1(b), a polysilicon layer 4 that is to serve later as a floating gate is grown over the entire surface by the CVD (Chemical Vapour Deposition) method. The dopants to provide the conductivity can be introduced thereinto, together with forming the polysilicon layer or afterwards through ion implantation. In this instance, concurrently with formation of the polysilicon layer, N-type dopants such as P are introduced thereinto.

Next, as shown in FIG. 1(c), the polysilicon layer 4 is patterned by means of lithography and dry etching to form a floating gate 5.

Next, as shown in FIG. 1(d), a heat treatment (hydrogen annealing) is performed in hydrogen atmosphere for smoothing down the vertices at both ends of the floating gate 5 and planarizing the gate surface and, thus, the shape of the floating gate is changed.

While the temperature for this hydrogen annealing must be certainly selected depending on the type of the annealing apparatus, the pressure in the apparatus or the hydrogen partial pressure, it is preferably set at or above 850° C. so as to produce a sufficient change of shape within a relatively short time period. It is more preferable to set at or above 900° C. and still more preferable to set at or above 950° C. As for the maximum annealing temperature, considering the limit for heat-resistance of the apparatus and control of the change in the dopant profile that may be caused by thermal diffusion, it is preferable to set at or below 1200° C. and more preferable, at or below 1100° C. and still more preferable, at or below 1050° C.

The hydrogen atmosphere for hydrogen annealing can be the atmosphere of 100% hydrogen but alternatively the atmosphere of a mixed gas in which an inert gas such as nitrogen, argon, helium or the like is mixed with the hydrogen gas can be used as long as the gas produces a prescribed transformation within a prescribed annealing time. Regarding the whole pressure of hydrogen atmosphere or hydrogen partial pressure, a reduced pressure is preferably employed in annealing for the sake of safety, but the atmospheric pressure or a raised pressure can be also used. In the case of low pressure annealing, for example, $5 \times 10^3$ Pa to $5 \times 10^4$ Pa can be selected.

The annealing time is set appropriately, according to the annealing temperature, the whole pressure of the hydrogen atmosphere or hydrogen partial pressure and the like. With ramp anneal, 30 seconds to 5 minutes of hydrogen annealing can accomplish a sufficient transformation.

As the heating method for the hydrogen annealing, there can be cited the lamp heating (lamp annealing) method and the heating method by a thermal diffusion furnace. For the hydrogen annealing of the present invention, the lamp anneal is preferable. The reason lies in the fact that, in the lamp anneal, raising or lowering the temperature can be made within a very short time period, in comparison with the method using a thermal diffusion furnace. As the time required for the annealing step can be shortened, the lamp annealing method can provide an excellent productivity and, at the same time, can restrain well the change of the dopant profile which may be caused by the thermal diffusion.

After hydrogen annealing is performed as described above, as an inter-gate insulating film 6, an ONO film (a silicon oxide film/a silicon nitride film/a silicon oxide film) is formed by the CVD method or the like, as shown in FIG. 1(e). Following that, after a polysilicon layer is formed by the CVD method over the entire surface, ion implantation of N-type dopants such as P and, then, patterning by means of lithography and dry etching are applied thereto, which forms a control gate 7.

Subsequently, for source-drain formation, ion implantation of dopants is carried out by an ordinary method.

In the non-volatile semiconductor device manufactured as described above, because the vertices at both ends of the floating gate are smoothed down and the gate surface thereof is planarized as shown in FIGS. 1(d) and (e), the leakage current between the floating gate 5 and the overlying control gate 7 can be reduced and, therefore, the dispersion of the erasure can be reduced and hold characteristic, improved. Moreover, this reduction of the leakage current allows the inter-gate insulating film to be formed thinner than hitherto and, consequently, the erasing voltage can be lowered, which makes it possible for the semiconductor device to operate at lower voltages. Further, when an ONO film is formed as an inter-gate insulating film 6, the CVD method is employed for the growth of the film in the conventional techniques because of the requirement that the oxide film on the side of the floating gate should be formed thick. Now, the present invention allows to use a thin oxide film, the film can be formed by the thermal oxidation method which is relatively simple and convenient.

In the present invention, hydrogen annealing is considered to act in the following way. Hydrogen annealing initially brings about reducing reactions on the surface of the floating gate, which break the Si-O bonds of polysilicon around the surface and make the surface migration readily happen. As a result, to achieve stabilization of the surface free energy, the surface of the floating gate is planarized and the vertices of the floating gate are smoothed down.

Figure 2:
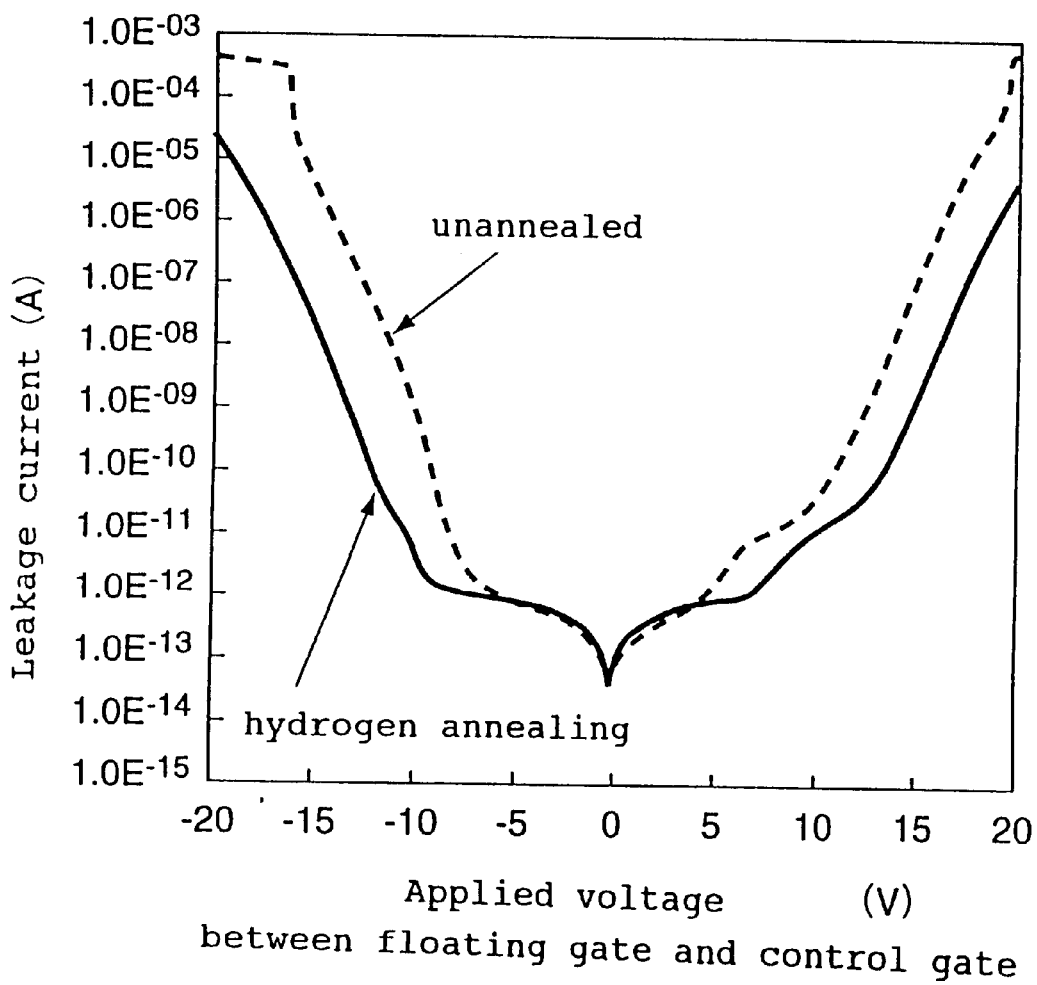
FIG. 2 is a graph depicting the leakage current between the floating gate and the control gate for the semiconductor devices annealed with hydrogen annealing and unannealed.

FIG. 2 depicts the leakage current between the floating gate and the control gate for the semiconductor devices annealed with hydrogen annealing and unannealed. As seen clearly in this graph, hydrogen annealing has the effect of reducing the leakage current.

Figure 3:
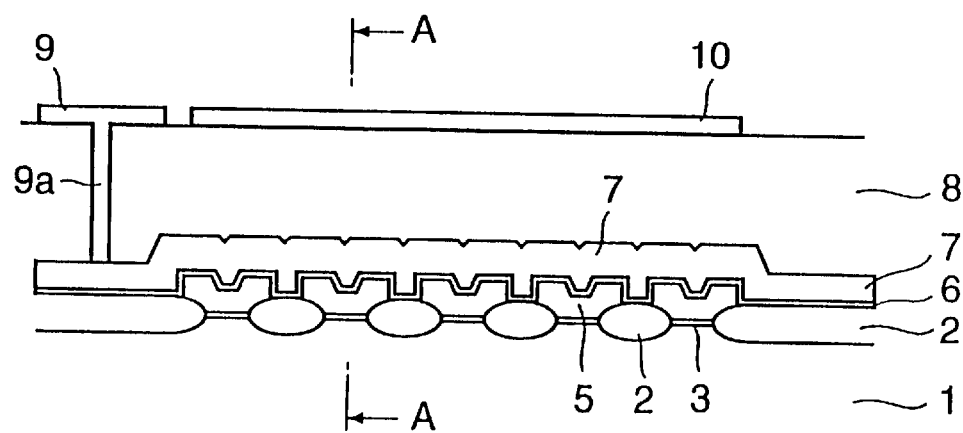
FIGS. 3(a)–3(b) are pair of views in explaining the semiconductor devices used for the measurements of the leakage current.
Figure 3:
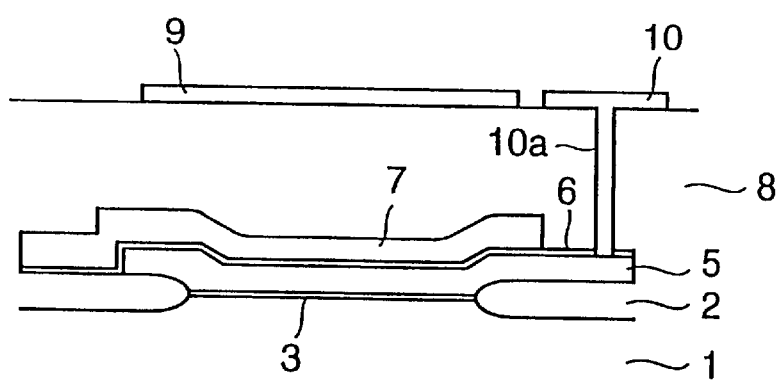
Figure 4:
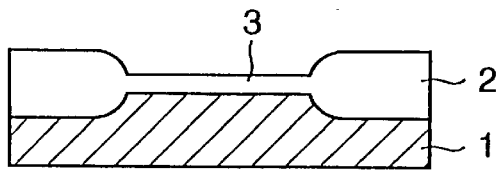
FIGS. 4(a)–4(e) are a series of cross-sectional views illustrating the steps of a conventional manufacturing method.
Figure 4:
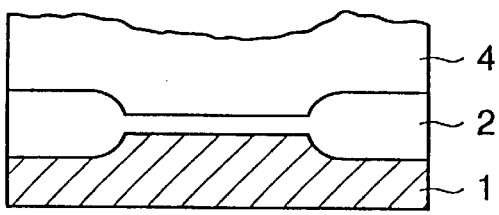
Figure 4:
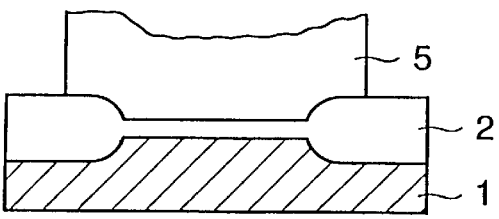
Figure 4:
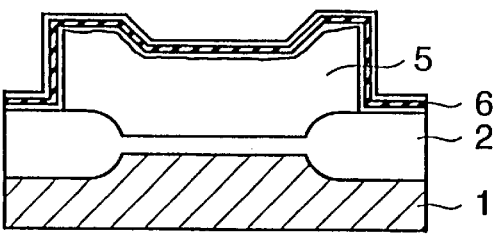
Figure 4:
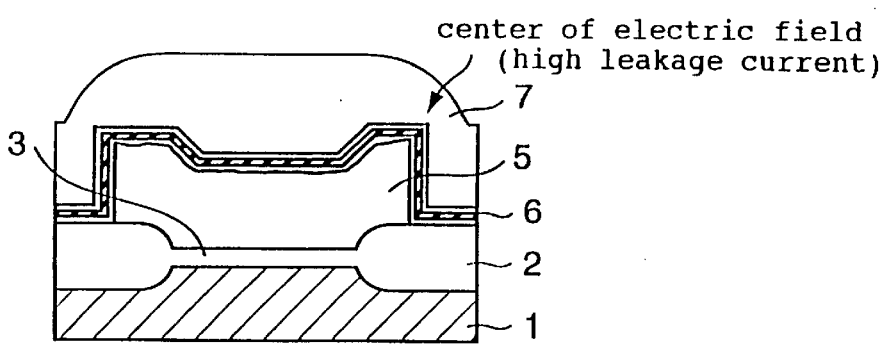

This measurement of the leakage current was made using semiconductor devices having a structure shown in FIG. 3. FIG. 3(a) is a cross-sectional view taken along the direction of the length of a control gate 7, and FIG. 3(b) is a cross-sectional view taken on line A—A of FIG. 3(a).

To measure the leakage current between a floating gate 5 and a control gate 7, on the side of the control gate, an interconnection 9 formed on an interlayer insulating film 8 was set connected through a contact 9a to the control gate as shown in FIG. 3(a), while, on the side of the floating gate, another interconnection 10 formed on the interlayer insulating film 8 was set connected through a contact 10a to the floating gate 5.

The thickness of the floating gate 5 was set to be 150 nm and the dopant (P) concentration thereof, $3 \times 10^{19} - 1 \times 10^{20}/cm^3$. The thickness of the control gate 7 was set to be 150 nm and the dopant (P) concentration thereof, $5 \times 10^{20}/cm^3$. A second insulating film was an ONO film and the thicknesses of layers therein were 6 nm/7 nm/6 nm, respectively, in this order.

Hydrogen annealing was carried out by means of ramp anneal in the atmosphere of 100% hydrogen at $1.33322 \times 10^4$ Pa (100 Torr) and 1000° C. for 1 minute (Temperature rising rate: 50° C./sec and temperature lowering rate: 50° C./sec).

What is claimed is:
1. A method of manufacturing a non-volatile semiconductor device having a structure in which layers of a first insulating film, a first polysilicon layer, a second insulating film, and a second polysilicon layer are formed, in this order, on a semiconductor substrate; which comprises:

forming the first insulating film on the semiconductor substrate and thereafter forming the first polysilicon layer;

patterning the first polysilicon layer;

performing a heat treatment in hydrogen atmosphere to planarize a top surface of the first polysilicon layer and round edges of the first polysilicon layer;

forming the second insulating film;

forming the second polysilicon layer; and patterning the second polysilicon layer.

2. The method of manufacturing a non-volatile semiconductor device according to claim 1, wherein the heat treatment in hydrogen atmosphere is carried out at a temperature not lower than 850° C.

3. The method of manufacturing a non-volatile semiconductor device according to claim 1, wherein the heat treatment in hydrogen atmosphere is carried out by means of ramp anneal.

4. The method of manufacturing a non-volatile semiconductor device according to claim 1, wherein the second insulating film is an ONO film.

5. The method of manufacturing a non-volatile semiconductor device according to claim 1, wherein the non-volatile semiconductor comprises a flash memory device, the first insulating film comprises a tunnel insulating film, the patterned first polysilicon layer comprises a floating gate, the second insulating film comprises an inter-gate insulating film, and the patterned second polysilicon layer comprises a control gate.

6. The method of manufacturing a non-volatile semiconductor device according to claim 1, wherein the heat treatment in hydrogen atmosphere is carried out by lamp anneal.

7. The method of manufacturing a non-volatile semiconductor device according to claim 1, wherein the second insulating film comprises an ONO film.

8. The method of manufacturing a non-volatile semiconductor device according to claim 1, wherein the heat treatment in hydrogen is carried out at a temperature not lower than 950° C. and not higher than 1050° C.

9. A method of manufacturing a non-volatile semiconductor device having a structure in which layers of a first insulating film, a first polysilicon layer, a second insulating film, and a second polysilicon layer are formed, in this order, on a semiconductor substrate, which comprises:

forming the first insulating film on the semiconductor substrate and thereafter forming the first polysilicon layer;

patterning the first polysilicon layer;

performing a heat treatment in hydrogen atmosphere at a temperature not lower than 850° C. to round edges of the first polysilicon layer;

forming the second insulating film;

forming the second polysilicon layer; and patterning the second polysilicon layer.

10. The method of manufacturing a non-volatile semiconductor device according to claim 9, wherein the heat treatment in hydrogen atmosphere is carried out by lamp anneal.

11. The method of manufacturing a non-volatile semiconductor device according to claim 9, wherein the second insulating film comprises an ONO film.

12. The method of manufacturing a non-volatile semiconductor device according to claim 9, wherein the non-volatile semiconductor comprises a flash memory device, the first insulating film comprises a tunnel insulating film, the patterned first polysilicon layer comprises a floating gate, the second insulating film comprises an inter-gate insulating film, and the patterned second polysilicon layer comprises a control gate.

13. The method of manufacturing a non-volatile semiconductor device according to claim 9, wherein the heat treatment in hydrogen is carried out at a temperature not lower than 950° C. and not higher than 1050° C.

* * * * *